United States Patent [19]

Shindo

[11] Patent Number: 5,510,640

[45] Date of Patent: Apr. 23, 1996

[54] SEMICONDUCTOR DEVICE AND PROCESS FOR PREPARING THE SAME

[75] Inventor: Hitoshi Shindo, Atsugi, Japan

[73] Assignee: Cannon Kabushiki Kaisha, Tokyo, Japan

[21] Appl. No.: 19,330

[22] Filed: Feb. 17, 1993

Related U.S. Application Data

[63] Continuation of Ser. No. 686,153, Apr. 16, 1991, abandoned.

[30] Foreign Application Priority Data

Apr. 17, 1990 [JP] Japan ............................ 2-099346
Apr. 12, 1991 [JP] Japan ............................ 3-106543

[51] Int. Cl.⁶ .................................................. H01L 27/01
[52] U.S. Cl. .......................... 257/347; 257/412; 257/507; 257/618; 257/755; 257/768
[58] Field of Search .......................... 357/23.7; 257/347, 257/507, 412, 618, 755; 437/62, 84, 235, 192, 193

[56] References Cited

U.S. PATENT DOCUMENTS

| | | | |
|---|---|---|---|
| 4,072,974 | 2/1978 | Ipri | 257/67 |
| 4,741,964 | 5/1988 | Haller | 357/23.7 |
| 4,746,961 | 5/1988 | Konishi et al. | 357/23.7 |

FOREIGN PATENT DOCUMENTS

| | | | |
|---|---|---|---|
| 0228317 | 12/1986 | European Pat. Off. | G09G 3/36 |
| 0271960 | 12/1987 | European Pat. Off. | G02F 1/33 |
| 0296603 | 6/1988 | European Pat. Off. | H04N 1/04 |
| 0308127 | 3/1989 | European Pat. Off. | H01L 31/10 |
| 0377084 | 7/1990 | European Pat. Off. | H01L 29/2784 |
| 56-135967 | 10/1981 | Japan | H01L 29/78 |
| 60-20582 | 2/1985 | Japan | H01L 29/78 |
| 60-117782 | 6/1985 | Japan . | |
| 61-187224 | 8/1986 | Japan | H01L 29/78 |
| 2-25036 | 1/1990 | Japan | H01L 21/336 |
| 2-91973 | 3/1990 | Japan . | |
| WO8902095 | 3/1989 | WIPO | G02F 1/33 |

OTHER PUBLICATIONS

S. M. Sze, "VLSI Technology", pp. 372–379 (1983).
*Japanese Journal of Applied Physics*, Suppl., vol. 22, No. 22–1, Jan. 1983, pp. 457–460, K. Ozawa, et al., "Contact-type Linear Sensor Using Amorphous Si Diode Array".

*Primary Examiner*—Edward Wojciechowicz
*Attorney, Agent, or Firm*—Fitzpatrick, Cella, Harper & Scinto

[57] ABSTRACT

A semiconductor device comprises a semiconductor layer including a source region, a drain region and a channel region provided on an insulating film. A gate insulating film separates the semiconductor layer from a gate electrode. A thickness of the channel region is smaller than a thickness of the source or drain region, and a level of an interface between the channel region and the insulating film is different from a level of an interface of the source or drain region and the insulating film. All the surfaces of the channel region, source region and drain region which face the gate electrode are on the same level.

8 Claims, 4 Drawing Sheets

SEMICONDUCTOR DEVICE AND PROCESS FOR PREPARING THE SAME

This application is a continuation of application Ser. No. 07/686,153 filed Apr. 16, 1991, now abandoned.

BACKGROUND OF THE INVENTION

1. Field of the Invention

This invention relates to a semiconductor device to be utilized for memory, logic circuit, image sensor etc. and a process for preparing the same. The invention is particularly directed to an SOI (Semiconductor on Insulator) type semiconductor device and a process for preparing the same.

2. Related Background Art

It has been desired to reduce parasitic capacitance in order to make a semiconductor device operate at a higher speed. A device which realizes the higher operating speed and also prevents latch-up to give good radiation resistance, an SOI structure has been well appreciated. On SOI, a semiconductor layer is formed on an insulating substrate, whereby the parasitic capacitance between the layer and the substrate can be reduced. As an example of the preparation method of SOI, there may be included Silicon on Sapphire (SOS), Separation by Implanted Oxygen (SIMOX), and laser/EB recrystallization methods.

The SOI device prepared according to these methods has attempted to be improved in performances by approximating the crystallinity of the semiconductor layer to that of a single crystal, and there is recently a study to obtain a very high mobility by the mechanism inherent in the device by making the film thickness ultra-thin (e.g. 0.1 μm thickness or less).

However, as one problem which occurs by making the semiconductor ultra-thin, the source and drain regions become also thinner as shown in the equivalent circuit of the transistor shown in FIG. 1. For this reason, the source resistance ($R_S$), and the drain resistance ($R_D$) become higher, and the resistance components may sometimes lower the actuation speed of the transistor.

In the prior art, to cope with such problem, there have been proposed, for example, a method in which a thick SOI layer is formed and only the channel portion is subjected to etching, or a method in which after oxidation, the oxidized film is removed, thereby making the channel portion thinner.

There is also a method in which after removal of the gate insulation films at the source and drain portions, films are formed by epitaxial growth so that only the source and drain portions become thick, as disclosed in Japanese Laid-open Patent Application No. 60-20582.

FIG. 2 is a schematic cross-sectional view showing the structure of such prior art example, wherein 1' is a thin channel region, 2' a thick drain region, 3' a thick source region, 4' a gate electrode.

However, in the prior art example, as shown in FIG. 2, after either making the portion corresponding to the channel region 1' thinner or making the portion corresponding to the source region 3' and the drain region 2' thicker, the gate electrode 4' is formed, and with the use of them as the mask, ion-implantation has been effected so as to form the source region 3' and the drain region 2'. For this reason, there is a fear that the portion made thicker so as to form the source and drain regions may be slipped off from the positions where source and drain are actually formed. Therefore, according to this method, it is required to perform registration, and for that purpose, an alignment margin a must be taken. According to the knowledge of the present inventors, the reason why the device of the prior art cannot accomplish sufficient high speed operation is that the semiconductor portion other than source and drain layers remain corresponding to the width of a, which causes parasitic capacitance to be increased.

Also, it has been found that in the upwardly concave structure as in the above-mentioned example of the prior art, an electrical field tends to be concentrated at the corner portions such as b and b', whereby deterioration of the gate insulation film dielectric strength is brought about to cause lowering in reliability.

SUMMARY OF THE INVENTION

An object of the present invention is to provide a semiconductor device capable of a higher speed actuation than in the prior art, and a process for preparing the semiconductor device.

Another object of the present invention is to provide a process for preparing a semiconductor device capable of obtaining high yield according to relatively simpler preparation steps than in the prior art, and for providing a semiconductor device high in reliability which can be prepared according to such simple steps.

Still another object of the present invention is to provide a process for preparing a semiconductor device which is lowered in parasitic resistance and has a constitution with deterioration of dielectric strength occurring with difficulty and a process for preparing the semiconductor device.

Still another object of the present invention is to provide a semiconductor device comprising a semiconductor layer including a source region, a drain region and a channel region provided on an insulating film, a gate electrode provided and a gate insulating film separating said semiconductor layer from the gate electrode. The thickness of said channel region is smaller than the thickness of said source drain region, and the level of the interface between said channel region and said insulating film is different from the level of the interface of said source or drain region and said insulating film.

Still another object of the present invention is to provide a process for preparing a semiconductor device which has a semiconductor layer including a source region, a drain region and a channel region provided on an insulating film, a gate electrode and a gate insulating film separating said semiconductor layer and the gate electrode. Said process comprising the steps of:

a) preparing a semiconductor substrate, b) providing a buffer layer on the site where said channel region is to be formed on said semiconductor substrate, c) after having said buffer layer provided, implanting ions which can react with the constituent material of said semiconductor layer to become an insulating material into the semiconductor substrate by the ion-implantation method, thereby preparing a semiconductor device wherein the thickness of said channel region is smaller than the thickness of said source or drain region, and also the level of the interface between said channel region and said insulating film is different from the level of the interface of said source or drain region and said insulating film.

DETAILED DESCRIPTION OF THE PREFERRED EMBODIMENTS

A preferable embodiment of the present invention is an SOI type transistor having a constitution in which the thickness of the source and drain portions are larger than that of the channel portion, and also the interface between the source and drain portions and the lower insulating layer is deeper than that of the channel portion and the lower insulating layer.

And, an embodiment of the present invention for obtaining the above-mentioned structure is a process for preparing a semiconductor device, which comprises forming a buffer layer at the portion where the channel region should be formed on the semiconductor substrate and then implanting ions capable of forming an insulating material through the reaction with the material of said semiconductor substrate into said substrate, thereby forming a semiconductor device with different thicknesses of the portions corresponding to the channel region and the source and drain regions by varying the depth of implanting said ions into said semiconductor layer.

Figure 3:
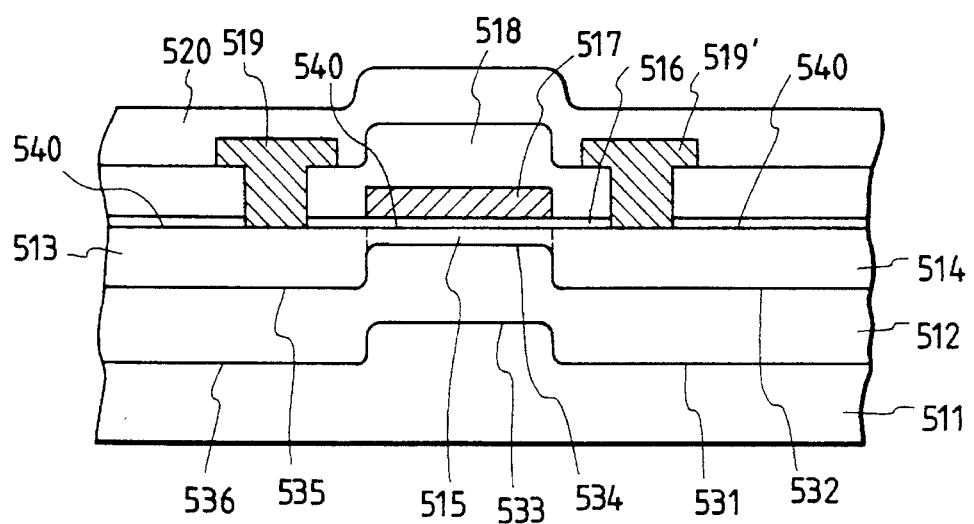
FIG. 3 is a schematic cross-sectional view for illustration of a preferred embodiment of the present invention.

FIG. 3 is a schematic cross-sectional view showing a semiconductor device according to the embodiment as described above. Here, 511 is a semiconductor substrate, and has an insulating film 512 and a semiconductor layer 514 at its upper portion. The insulating layer 512 has different interface levels between beneath the channel region 515 and beneath the source and drain regions 513, 514. The interface 533 is positioned close to the surface 540 than the interfaces 531 and 536, and similarly the interface 534 is positioned nearer to the surface 540 than the interfaces 532 and 535.

Therefore, since the surface 540 of the channel, source and drain are on the common level, the thickness of the source and drain regions 513, 514 are larger than that of the channel region 515.

Reference numeral 516 is a gate insulating film, reference numeral 517 is a gate electrode, reference numerals 519 and 519' are source and drain electrodes. Reference numeral 518 is an interlayer insulating film and reference numeral 520 is a protective layer.

The present semiconductor device can be made as an N channel FET, or a P channel FET by setting suitably the conduction types of the regions 513, 514, 515, i.e. source, drain, channel. Of course, by a combination of them, an SOI type CMOS circuit can be constituted.

The semiconductor device prepared by use of the above-mentioned preparation process can make the source and drain regions lower in resistance, and at this time very little the deterioration of dielectric strength of the gate insulating film will occur.

As the buffer layer to be employed for formation of the channel region with a predetermined thickness, a material which can make smaller the distance reached of the ions for formation of the insulating layer within the substrate may be employed. For example, semiconductor materials such as non-mono-crystalline silicon conventionally can be used in semiconductor process, insulating materials such as silicon oxide, silicon nitride, etc. or metals such as Al, W, Mo, Cu, etc. and alloys containing said metals or silicide, etc. may be employed.

The thickness of the buffer layer on the channel should be desirably a thickness corresponding to the difference between the film thickness of the channel to be formed and the film thickness of the source and drain.

This is because the reaching distance of ions such as oxygen ions or nitrogen ions depends greatly on the film thickness of the buffer layer, but not so much on the material of the buffer layer. Its representative mechanism is as described below. The ions emitted from the ion source by application of a voltage are implanted through the buffer layer into the site for formation of the channel region. The buffer layer is a film thicker than the second buffer layer (film for protection used in conventional ion-implantation method of B and P) existing on the site for formation of source and drain regions.

Since the ions implanted toward the site where the channel is to be formed lose their movement energies during passing through the buffer layer, they can reach only the position as shown by the interface 533. In contrast, the ions implanted toward the site where source and drain are to be formed will lose little movement energies during passage through the thin second buffer layer, and therefore can reach even the interfaces 531, 536.

Accordingly, the thickness is set suitably corresponding to the source and drain regions and the channel to be formed. Hence, it can be made the thickness which is substantially equal to the difference between the thickness of the channel region to be formed and the thickness of the source and drain regions.

Therefore, in view of the mechanism as described above, by using a gate insulating film and a gate electrode material for the buffer layer at the portion corresponding to said channel region and using a gate insulating film for the buffer layer at the portion corresponding to the source and drain regions, a self-alignment process can be realized in the thin portion and the channel region and in the thick portion and the source and drain regions of the semiconductor layer.

The thickness of the channel region in the present invention is determined depending on the acceleration voltage and the dose of the oxygen ions ($O^+$) implanted, the film thickness and the material of the buffer layer, etc.

The acceleration energy of the oxygen ions implanted, if it is too large, will increase the crystal defects in the mono-crystalline layer of the channel portion to worsen the characteristics. On the other hand, if it is too small, the thickness of the mono-crystalline layer becomes too thin, which will also exert deleterious influences on the characteristics. Hence, the acceleration voltage of the ions implanted should be desirably set within the range of 0 eV to 240 eV, more desirably at 180 eV to 220 eV.

The dose in the present invention has the action of making the layer thickness of the insulation layer larger and the layer thickness of the mono-crystalline layer smaller, as its setting amount is larger. In the present invention, the layer thickness of the mono-crystalline layer in the source and drain regions should be as large as possible, and also the layer thickness of the lower barrier layer comprising the insulating layer should be desirably larger. For making the layer thicknesses of the two layers within desirable range, it is preferable to set the dose at $8.0 \times 10^{17}$ to $2.5 \times 10^{18}/cm^2$, more preferably, $1.2 \times 10^{18}$ to $2.0 \times 10^{18}/cm^2$.

The present invention is described by referring to the following Examples.

EXAMPLE 1

FIGS. 4A–4E show the preparation steps of the semiconductor device of Example 1.

The preparation steps of the semiconductor device of this Example are described below.

Figure 4A:
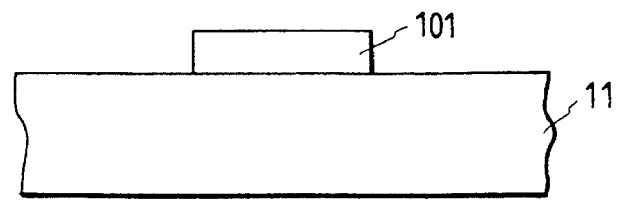
FIGS. 4A–4E are schematic views for illustration of the preparation method of the semiconductor device according to the first embodiment of the present invention.

First, as shown in FIG. 4A, the surface of the P type Si substrate 11 with the plane direction (100) having a specific resistivity of 1000 Ω·cm was thermally oxidized to form an $SiO_2$ film with a thickness of 950 Å as the buffer layer 101.

Next, the above thermally oxidized film 101 at the portion corresponding to the source, drain was removed by patterning.

Figure 4B:
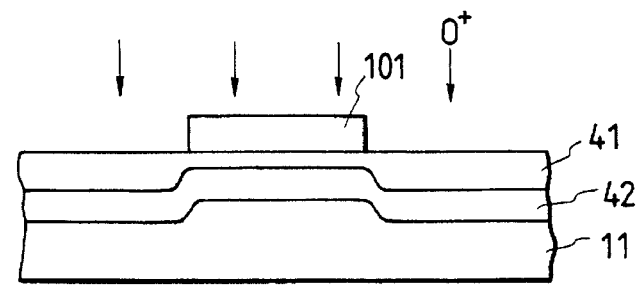
Figure 4C:
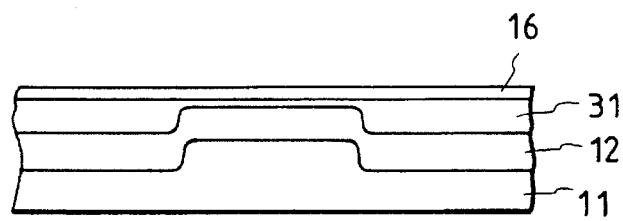
Figure 4D:
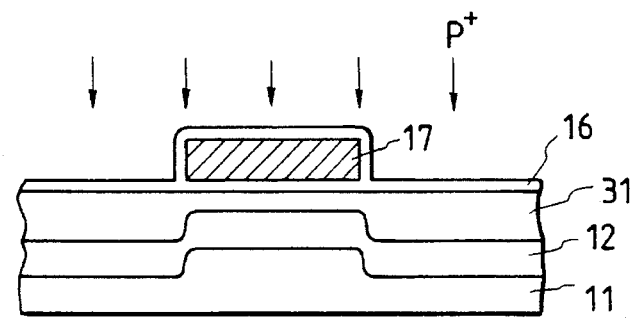
Figure 4E:
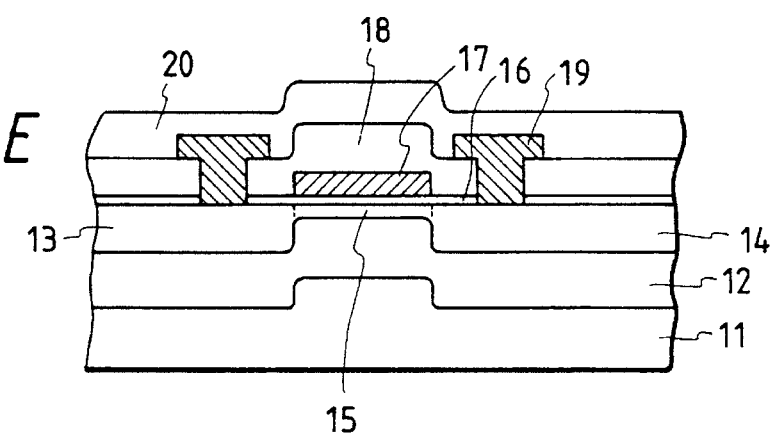

Then, as shown in FIG. 4B, by use of an ion implantation apparatus well known in the art, oxygen ions ($O^+$) at an acceleration voltage 200 keV, a total dose of $1.8 \times 10^{18}/cm^2$, and a substrate temperature of 600° C. Thus, within the Si wafer, a layer 41 wherein substantially no oxygen atom existed and a layer 42 wherein oxygen atoms exist to the same extent as silicon atoms were formed.

Here, the flight distance of oxygen atoms within the silicon of the lower layer of the buffer layer 101 becomes shorter than the flight distance of the oxygen atoms within peripheral silicon corresponding to the buffer layer 101.

Figure 1:
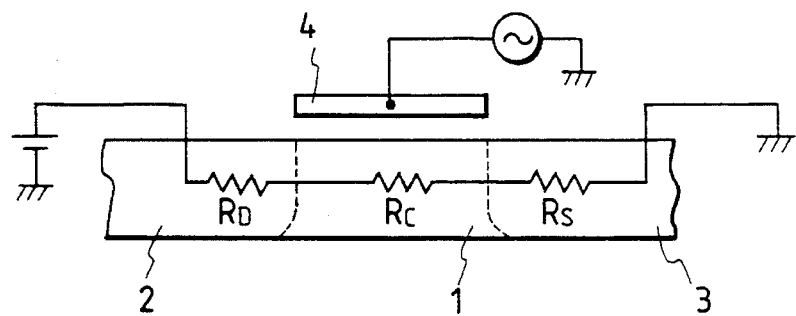
FIG. 1 is a schematic sectional view for illustration of the equivalent circuit of the semiconductor device having an MOS transistor.
Figure 2:
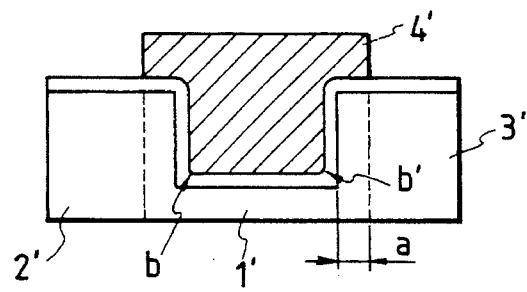
FIG. 2 is a schematic cross-sectional view showing a part of an MOS transistor in the prior art.

Next, as shown in FIG. 2C, the substrate was subjected to annealing in $N_2$ gas atmosphere at 1350° C. for 30 minutes. Thus, at the portion corresponding to source and drain, a mono-crystalline layer 31 with a thickness of about 2200 Å was formed on the surface side, and a lower barrier layer 12 comprising silicon oxide with a thickness of about 3700 Å at the lower part thereof. At the portion corresponding to the channel portion, a mono-crystalline layer 31 with a thickness of about 940 Å was formed on the surface, and a lower barrier layer 12 comprising silicon oxide with a thickness of about 3700 Å formed at the lower part thereof. Subsequently, after the insulating film on the surface was etched away, a gate oxide film 16 with a thickness of about 500 Å was formed by the thermal oxidation.

Next, as shown in FIG. 2D, an $n^+$ type poly-Si was deposited to about 4000 Å on the portion where the channel portion is to be formed to form a gate electrode 17.

Then, for forming a buffer film for ion implantation to be used for formation of source and drain, wet oxidation of 850° C., $H_2/O_2=0.5$ was carried out for 80 minutes. With the oxidized film formed by the oxidation as the buffer film, phosphorus ions ($p^{31}$) were ion implanted under the conditions of 35 keV, $1 \times 10^{15}/cm^2$, and high impurity concentration regions 13, 14 of source and drain are formed according to the self-alignment process with the gate electrode 17 as the mask.

Then, an interlayer insulating film 18 comprising silicon oxide was deposited, and subjected to annealing of 900° C., 30 minutes for activation of the impurities in source and drain regions to form contact holes. Subsequently, a wiring 19 was formed to form a passivation film 20 comprising silicon nitride, thereby preparing an n channel MOSFET.

When the actuation characteristics of the n-MOSFET were examined, the resistance values of source and drain became about ⅓ as compared with those of one having the same thickness of source and drain as the thickness of the channel portion, whereby the actuation speed became about 3-fold. Also, the dielectric strength of the gate insulating film exhibited good result of 10 MV/cm or more.

Also, the electrical field concentration was also alleviated at the drain edge to improve the drain dielectric strength.

EXAMPLE 2

Next, Example 2 of the present invention is described.

This example prepares the semiconductor device according to the present invention without the use of the buffer layer 101 which is finally removed in the foregoing Example 1.

More specifically, the gate electrode itself is used as the buffer layer, and the thin portion of the semiconductor and the channel portion, and the thick portion and the source and drain regions are formed by self-alignment.

Figure 5A:
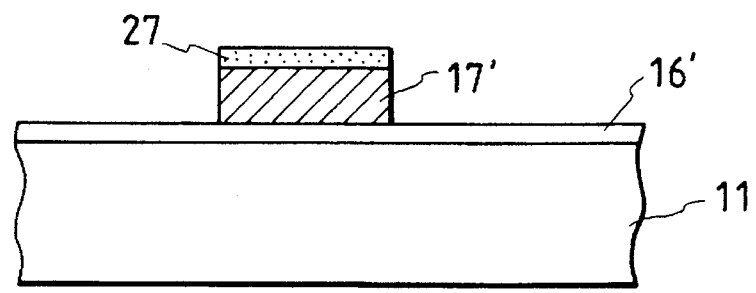
FIGS. 5A–5C are schematic views for illustration of the process for preparing the semiconductor device according to the second embodiment of the present invention.
Figure 5B:
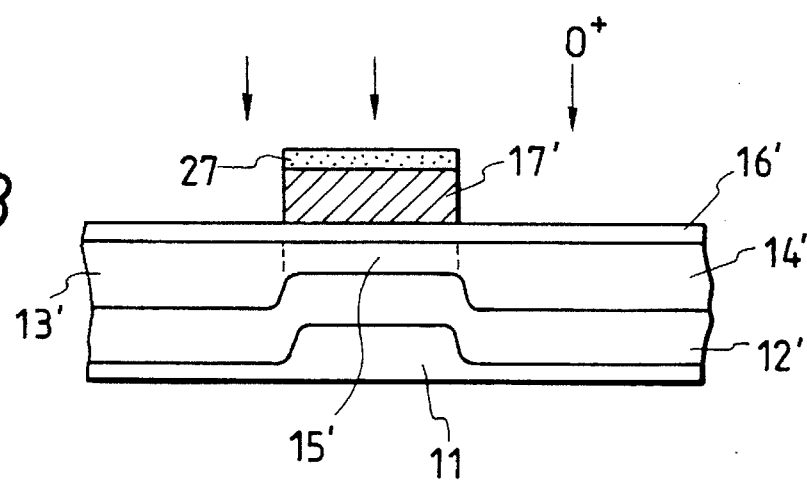
Figure 5C:
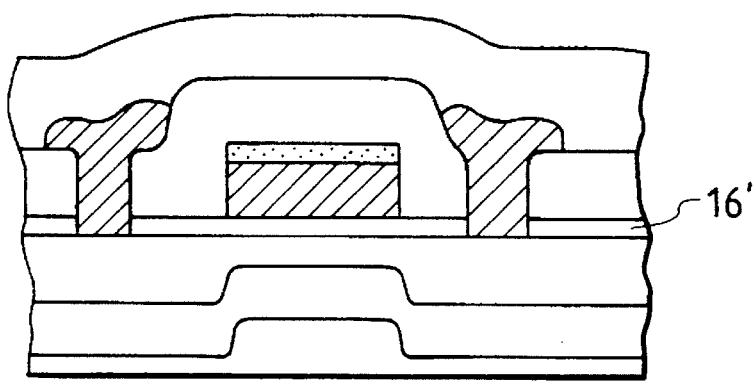

FIGS. 5A–5C are schematic views for illustration of the semiconductor device of Example 2. As shown in the Figure, first on a P type Si substrate 11 with the plane direction (100) having a specific resistivity of 1000 Å·cm, a gate insulating film 16' of 500 Å was formed according to the thermal oxidation method.

Next, after $n^+$ type poly-Si was deposited and $WSi_2$ 27 deposited, said n type poly-Si and WSi are subjected to patterning to form a gate electrode 17 comprising a poly-silicon 17' with a thickness of 500 Å and WSi 27 with a thickness of 500 Å.

Next, with the above-mentioned gate insulating film 16' as the buffer layer for formation of the source and drain regions, and with the gate electrodes 17', 27 and the gate insulating film 16' as the buffer layer for formation of the channel region, oxygen was implanted into the substrate at an acceleration voltage of 200 keV, a total dose of $1.8 \times 10^{18}/cm^2$, a substrate temperature of 600° C. (FIG. 5B).

When the substrate was subjected to annealing in $N_2$ gas atmosphere at 1350° C. for 30 minutes, a single crystalline layer 15' of about 540 Å was formed in the channel region and a barrier layer 12' comprising silicon oxide of 3700 Å in the lower portion thereof, while in the source and drain regions 13', 14' a Si mono-crystalline layer of 1700 Å was formed. A barrier layer 12' comprising silicon oxide of 3700 Å was formed in the lower portion thereof.

Then, similarly as in Example 1, source, drain interlayer insulating films were formed with the gate electrodes 17', 27 as the mask, followed by formation of contact holes, wiring, passivation film to form an n-channel MOSFET (FIG. 5C).

When the actuation characteristics of the n-MOS were examined, the actuation speed was improved similarly as in Example 1, the insulating film dielectric strength was also good, and the parasitic capacity of the drain was also reduced to ½ or less of the prior art.

The transistor as described above can be employed in an electronic circuit device such as three-dimensional integrated circuit, close contact type image sensor and liquid crystal display device to improve its device characteristics to great extent. Further, such electronic circuit device can be mounted on information processing apparatus such as facsimile, image reader, word processer, liquid crystal television, etc.

Figure 6A:
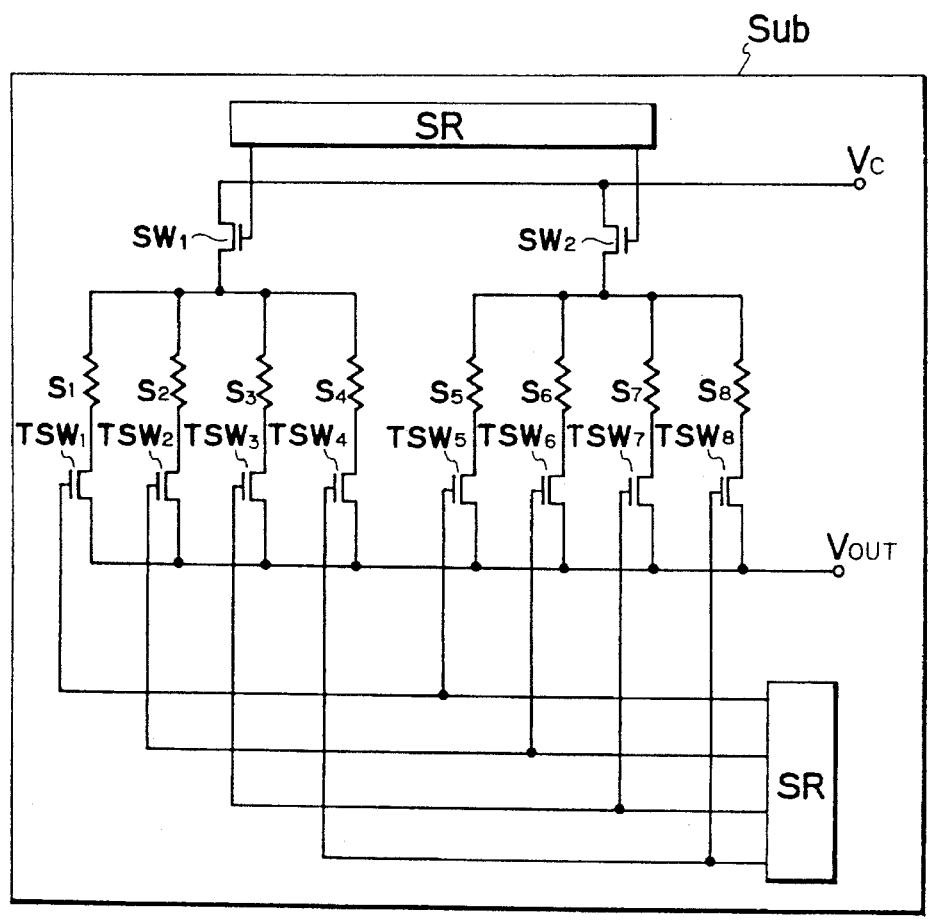
FIG. 6A is a circuit diagram of a close contact type image sensor.

FIG. 6A is a circuit diagram of the close contact type image sensor, and the transistor according to the present invention is formed as the switch means for signal reading integrally together with the light-receiving device for photoelectric conversion on the same substrate.

In FIG. 6A, for brevity of explanation, description is made by referring to an example of 4 segments×2 blocks. The respective light-receiving devices $S_1$-$S_8$ are connected through the TFT switches $SW_1$, $SW_2$ for block selection to the standard voltage source Vc commonly for each block. The other electrodes of the respective light-receiving devices $S_1$-$S_8$ are connected respectively to the TFT switches $TSW_1$ to $TSW_8$ for segment selection, the respective gates of the TFT switches $TSW_1$-$TSW_8$ are commonly connected mutually between the corresponding segments within each block to constitute the gate common line, and the respective sources scanned by the shift register SR are commonly connected and output through the common output line $V_{out}$.

Figure 6B:
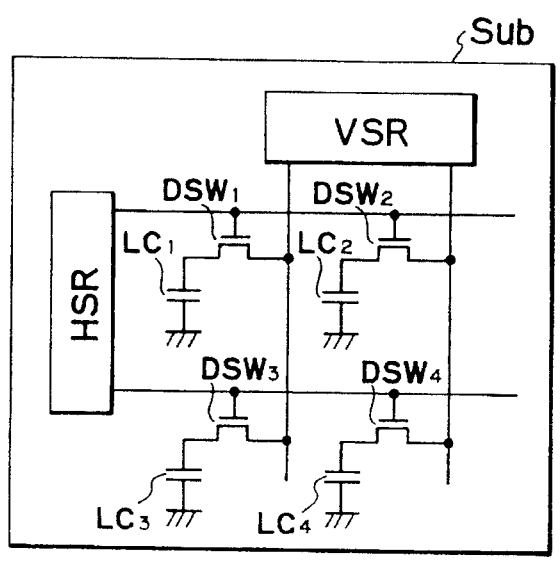
FIG. 6B is a circuit diagram of a liquid crystal display device.
Figure 6C:
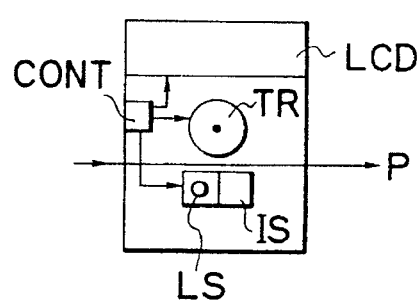
FIG. 6C is a schematic view of an information processing apparatus.

Such image sensor IS constitutes the information processing apparatus together with a light source LS for illumination of original manuscript, a transporting roller which is also a holding means to hold the original manuscript P at the reading position and a control means CONT which controls the light source LS, the roller TR and the image sensor IS (FIG. 6C).

FIG. 6B is a circuit diagram showing a liquid crystal display device, the transistor of the present invention is used for the switches $DSW_1$-$DSW_4$ for driving liquid crystal cells $LC_1$-$LC_4$ consisting each picture elements, the gates and the sources are combined in a matrix and driven by the shift resister VSR for vertical line selection and the shift resister HSR for horizontal line selection.

Such liquid crystal display device is mounted on an information processing apparatus shown in FIG. 6C and the output signals read by the above-mentioned sensor by the control means are inputted in the liquid crystal display device to display the image. Thus, monitoring of the manuscript original reading is rendered possible.

As described above, according to the present invention in the thin film SOIMOS transistor, lowering in actuation speed by the resistance of source, drain can be improved, and also a semiconductor device with high performances without deterioration of dielectric strength of the gate insulating film or increase of parasitic capacity as in the prior art example can be obtained.

What is claimed is:

1. A semiconductor device comprising:

a semiconductor layer including a source region, a drain region and a channel region provided on an insulating film;

a gate electrode having a multi-layer structure of polycrystalline silicon and one of a metal having a high melting point and an alloy having a high melting point; and a gate insulating film separating said semiconductor layer and said gate electrode, wherein a thickness of said channel region is smaller than a thickness of said source or drain region, wherein a level of an interface between said channel region and said insulating film is different from a level of an interface of said source or drain region and said insulating film and wherein all the surfaces of said channel region, source region and drain region which face said gate electrode are on the same level, and wherein a width of said gate electrode is substantially the same as a width of said channel region.

2. A semiconductor device according to claim 1, wherein said insulating film is provided on the semiconductor region.

3. A semiconductor device according to claim 1, wherein the surface of said channel region and the surface of said source and drain regions are on the same level.

4. A semiconductor device according to claim 1, wherein said semiconductor layer comprises mono-crystalline silicon.

5. A semiconductor device according to claim 1, wherein said semiconductor device comprises an MOS type field effect transistor.

6. A semiconductor device according to claim 5, wherein said MOS type field effect transistor comprises an N channel MOS type field effect transistor.

7. A semiconductor device according to claim 5, wherein said MOS type field effect transistor comprises a P channel MOS type field effect transistor.

8. A semiconductor device according to claim 1, wherein said insulating film comprises silicon oxide.

\* \* \* \* \*

UNITED STATES PATENT AND TRADEMARK OFFICE
CERTIFICATE OF CORRECTION

PATENT NO. : 5,510,640

DATED : April 23, 1996

INVENTOR(S) : HITOSHI SHINDO

It is certified that error appears in the above-identified patent and that said Letters Patent is hereby corrected as shown below:

COLUMN 1

Line 21, "whereby-the" should read --whereby the--.

COLUMN 2

Line 4, "remain" should read --remains--.

COLUMN 3

Line 53, "close" should read --closer--;

Line 55, "nearer" should read --closer; and

Line 61, "reference" should read --and reference--.

COLUMN 4

Line 7, "the deterioration of" should read --deterioration of the--.

UNITED STATES PATENT AND TRADEMARK OFFICE
CERTIFICATE OF CORRECTION

PATENT NO. : 5,510,640

DATED : April 23, 1996

INVENTOR(S) : HITOSHI SHINDO

It is certified that error appears in the above-identified patent and that said Letters Patent is hereby corrected as shown below:

<u>COLUMN 6</u>

Line 31, "1000 Å•cm," should read --1000 Ω•cm,--;

Line 35, "n type" should read --n⁺ type--; and

Line 55, "drain" should read --drain and--.

Signed and Sealed this

Tenth Day of September, 1996

BRUCE LEHMAN

Attest:

Attesting Officer

Commissioner of Patents and Trademarks